United States Patent [19]

Tedd et al.

[11] Patent Number: 4,570,116
[45] Date of Patent: Feb. 11, 1986

[54] INSTRUMENT FOR MEASURING ELECTRICAL RESISTANCE OR REACTANCE

[75] Inventors: David C. Tedd, Folkestone; John B. Williams, Huntingdon, both of England

[73] Assignee: Thorn EMI Instruments Limited, Dover, England

[21] Appl. No.: 499,268

[22] Filed: May 31, 1983

[30] Foreign Application Priority Data

Jun. 1, 1982 [GB] United Kingdom ............... 8215907

[51] Int. Cl.[4] ............................................. G01R 27/00
[52] U.S. Cl. .................................................. 324/57 R
[58] Field of Search ................. 324/57 R, 60 R, 59, 324/83 A, 83 R, 62; 328/133

[56] References Cited

U.S. PATENT DOCUMENTS 4,118,665 10/1978 Reinhardt ...................... 324/57 R

FOREIGN PATENT DOCUMENTS 1003066 9/1965 United Kingdom .
1300436 12/1972 United Kingdom .
1352216 5/1974 United Kingdom .

OTHER PUBLICATIONS

Maeda, An Automatic, Precision 1 Mhz Digital LCR Meter, 3-1974, pp. 2-9, hp Journal.

Primary Examiner—Stanley T. Krawczewicz
Assistant Examiner—Jack B. Harvey
Attorney, Agent, or Firm—Fleit, Jacobson, Cohn & Price

[57] ABSTRACT

An instrument for measuring electrical resistance or reactance comprises a sine wave generator which generates an a.c. signal and reference signals for a phase sensitive detector. The a.c. signal is applied to a decade attenuator which adjusts its amplitude in dependence on a range switching. The signal is passed to a bridge section, wherein it is applied to a component to measure the value thereof. A voltage output, indicative of the value, is fed to a gain block, wherein its amplitude is re-adjusted in dependence on an input from the range switching. The voltage output is operated on by a phase sensitive detector and passes to a digital display. In the reactance mode, set by a function switching, the a.c. signal is phase shifted before being applied to the component, so that the voltage output is in phase with the reference signals.

6 Claims, 5 Drawing Figures

INSTRUMENT FOR MEASURING ELECTRICAL RESISTANCE OR REACTANCE

This invention relates to an instrument for measuring resistance or reactance of resistive, capacitive or inductive electrical components and particularly though not exclusively, to a digital instrument for measuring the same.

It is known to provide so-called digital "LCR" measuring instruments, although such instruments available hitherto have tended to be expensive and rather cumbersome. Portable instruments of this type usually include bridge circuits and involve balancing the unknown resistance or reactance against the known values of components in the bridge circuits. Usually, analogue displays are provided, and these tend to be slower to use than digital instruments.

One of the problems which arises in "LCR" measuring instruments is the requirement of a 90° phase shift of a signal applied to the component to be measured for the measurement of reactances as compared with resistance measurement. Previous methods of achieving this phase shift have typically resulted in the measurements made being dependent on the frequency of the signal, which thus can cause substantial errors in the measurements.

Moreover, there is an additional problem of providing a basic range for all three measuring modes, i.e. resistance, capacitance and inductance, and also being able to change the range simply and accurately.

Digital capacitance meters are also known, but they too suffer from the problem of frequency dependence, as the capacitance is measured with a ramp waveform at a frequency which depends on the applied signal.

It is therefore an object of the present invention to provide an improved type of instrument for measuring resistance or reactance, as appropriate, of resistive, capacitive or inductive electrical components.

According to the present invention, there is provided an instrument for measuring resistance or reactance of resistive, capacitive or inductive electrical components comprising generating means for producing an a.c. electrical signal, switching means for selecting a mode for measuring resistance or reactance and for selecting a magnitude from a set range for said amplitude of the a.c. signal, means for applying said a.c. signal to a component to be measured and for producing a voltage signal indicative of the value of said component, means for responding to said voltage signal to produce a measurement of the value of said component which is substantially independent of frequency, means for adjusting the amplitude of the voltage signal back to a required level and applying said voltage signal to display means, the instrument further including means for providing, in the mode for measuring reactance, an appropriate phase shift of the a.c. electrical signal prior to the a.c. signal being applied to the component to be measured.

In a preferred embodiment of the invention the generating means comprises a sine wave generator which digitally generates a sine wave, which is achieved by deriving the amplitude from a d.c. reference. The sine wave generator also generates in-phase and anti-phase reference signals for a phase sensitive detector provided in the circuit after the measurements have been made.

Previously, when measuring the reactance of a component, a 90° phase shift of the signal has been achieved by moving the reference phase of the phase sensitive detector by 90°.

In the present invention, a different method is employed, wherein an integrator, which produces a 90° phase shift relative to the phase reference signals, is inserted after the sine wave generator but before the signal is fed to the section wherein the measurements are made. This phase-shifted signal is then applied to the component to be measured and a voltage output signal, which is indicative of either the inductance or capacitance of the component and which is in-phase with the reference signals, will be produced, whilst output signals at 90° to the reference signals are suppressed, by the phase sensitive detector.

This method therefore has an advantage of ensuring that the resulting measurements are substantially independent of frequency.

A simple method of changing the range of each measuring mode is achieved by adjusting the amplitude of the sine wave voltage signal to a convenient magnitude before it is passed through the section wherein the measurements are made and then amplifying the signal back to the correct level for the phase sensitive detector and an analogue to digital converter. Suitable combinations of input attenuation and output gain allow all the required ranges to be achieved.

The present invention will now be further described by way of example only with reference to the accompanying diagrams, wherein.

Figure 1:
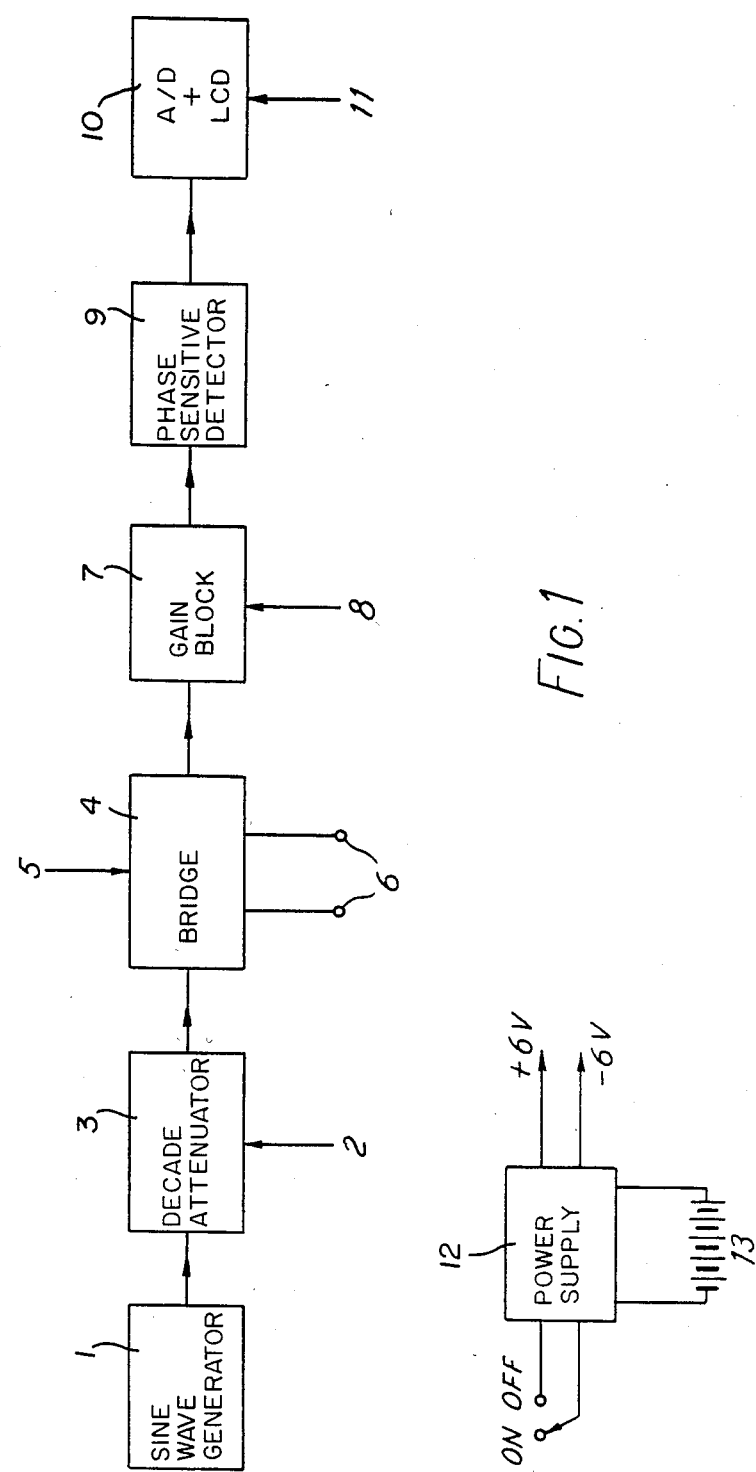
FIG. 1 shows a block diagram of a complete embodiment of the invention.

FIG. 1 shows a block diagram indicating each section of the embodiment. A sine wave generator 1 digitally generates a sine wave of substantially constant amplitude, the sine wave output being fed to a decade attenuator 3. A substantially constant amplitude is required for the technique used in the preferred embodiment although if alternative techniques such as input tracking, are employed a constant amplitude may not be essential. By operation of range switching 2, the required magnitude of the amplitude of the sine wave can be selected. The decade attenuator 3 normally attenuates the sine wave, but on one particular range, it has a gain of 10. The digital sine wave signal is passed to a bridge section 4, where the incoming signal is either applied directly to a component of unknown value, which is connected to inputs 6, via an integrator (not shown in FIG. 1), or it is converted to a current before being applied to the component. The method used depends on the measurement required, i.e., capacitance, resistance or inductance, which is chosen by function switching 5.

A voltage output, indicative of the value of the component, is fed from the bridge section 4 to a gain block 7, wherein the voltage is amplified by a decade value which depends on the preselected range on the range switching, which has an input to the gain block at 8. This amplification of the voltage brings its magnitude back to the correct level for following circuits.

The voltage signal is then operated on by a phase sensitive detector 9, which derives its reference switching signal directly from the logic within the sine wave generator 1, which produces the sine wave.

Once rectified, the signal is fed to a single chip analogue to digital converter and a liquid crystal display, both shown at 10. Decimal point driving arrangements for the LCD are fed into this section at 11 and they are incorporated within the range switching.

All the circuitry is powered from a power supply 12, which converts the voltage from a 9 V battery 13 to a +6 V and −6 V supply, which is required by the instrument.

Figure 2:
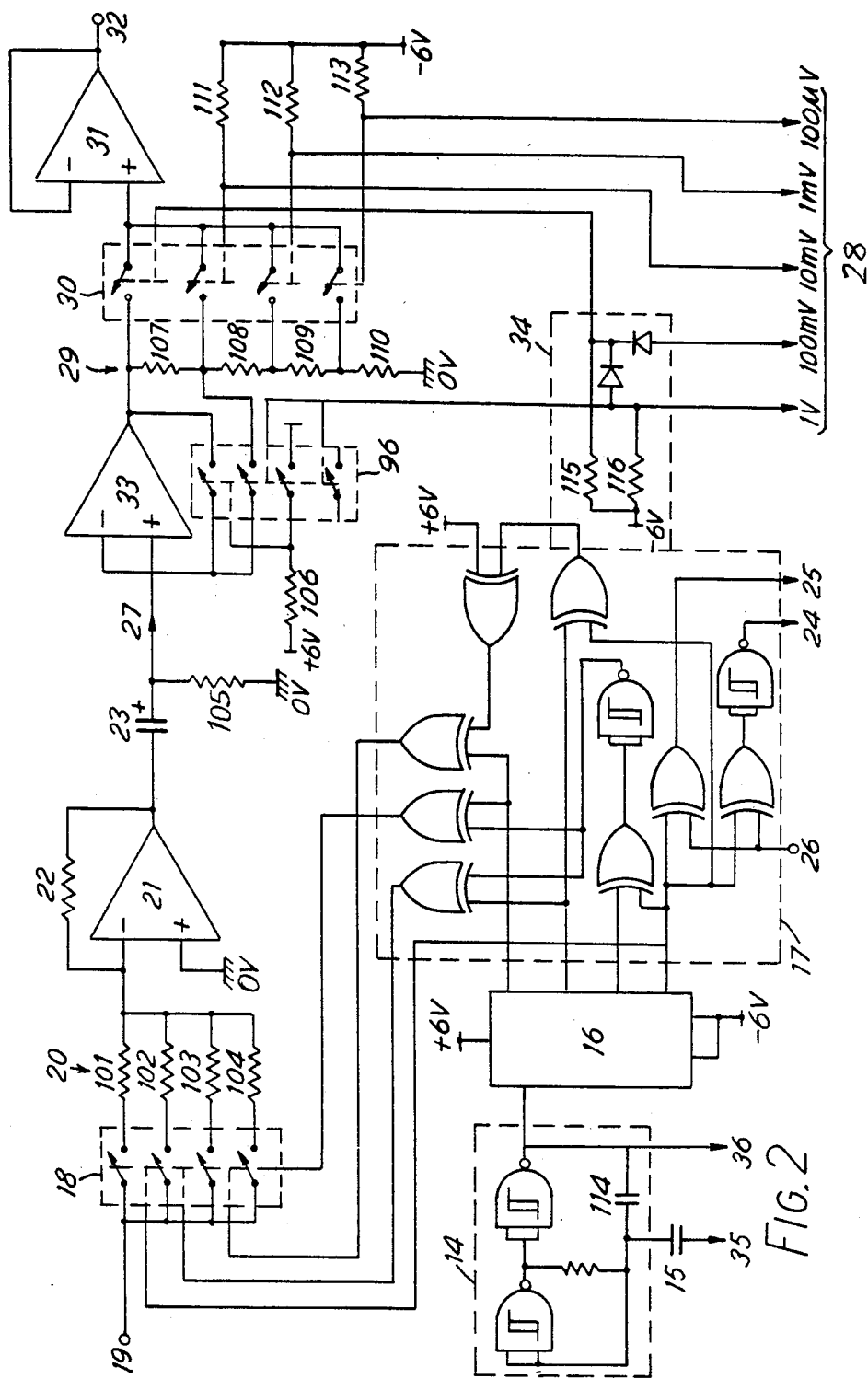
FIGS. 2 to 5 show circuit diagrams of various sections of the embodiment.

FIG. 2 shows a circuit diagram of the first two sections of the embodiment, namely the sine wave generator and the decade attenuator. The sine wave generator comprises a basic clock 14, which is an RC and CMOS inverter oscillator and which normally runs at about 16 KHz but can be lowered to about 1.6 KHz by connecting an additional capacitor 15 into the oscillator. Outputs 35 and 36 are connected to the range switching (not shown), so that capacitor 15 can be connected to lower the measuring frequency from about 1 KHz to about 100 Hz, which has the effect of compressing the impedance range and thus extending the component value range that can be measured within the dynamic range of the circuit. The clock 14 passes to a binary counter 16 of four stages which, together with a number of exclusive OR gates 17 interconnected as shown, generates Walsh functions, which are a set of periodic rectangular waveforms which can be combined to form more complex waveforms. In this instance, four Walsh functions are used to generate a 16-step sine wave. The Walsh function signals operate semi-conductor switches 18 which connect a 1.2 V reference 19 to four "weighting" resistors 20, which provide the Walsh functions with the correct "weighting" to produce the required sine wave. This connection generates the correct weighted currents which are passed to the virtual earth of amplifier 21. The amplifier 21 has a feedback resister 22 which converts the currents into a stepped sine wave voltage signal of about 100 mV.

A sine wave may be produced with a d.c. offset, but the latter is easily removed by capacitor 23.

In-phase and anti-phase reference signals, shown respectively at 24 and 25, which are required for the phase sensitive detector (shown later in a following diagram) are generated within the Walsh function logic 17. A 90° phase shift required for inductance and capacitance measurements is obtained by inserting an integrator (shown in a following diagram) into the measurement path. As this inverts the signal, for resistance measurements, a resistance signal 26 changes over the phase reference signals, 24 and 25, to correct the polarity of the signal fed to the analogue to digital converter (not shown).

An nominal 100 mV sine wave signal 27 is fed into the scaling circuit, which scales the signal to the magnitude required for measurement. Selected inputs are 1 V, 100 mV, 10 mV, 1 mV and 100 V, shown at 28, which originate from the range switching. These are all generated from one universal divider consisting of a chain of four accurate resistors 29 and semi-conductor switches 30.

The attenuated ranges are achieved by tapping the appropriate point of the resistor chain 29 so produced with the input connected to the top of the chain. The output is buffered with a non-inverting amplifier 31 and is then fed to the next section via output 32.

The 1 V range requires a gain of 10 and this is achieved by a second amplifier 33, which is used as a non-inverting buffer with its output connected to the top of the universal divider, resistors 29 and semi-conductor switches 96. To obtain the required gain, the tapping point is moved one tap down the switches 96, so that the feedback voltage is one tenth of the output voltage and hence there is a gain of 10. A diode and resistor OR gate 34 is used, so that either the 1 V or 100 mV signals switch in the "times 1" tap on the divider.

Figure 3:
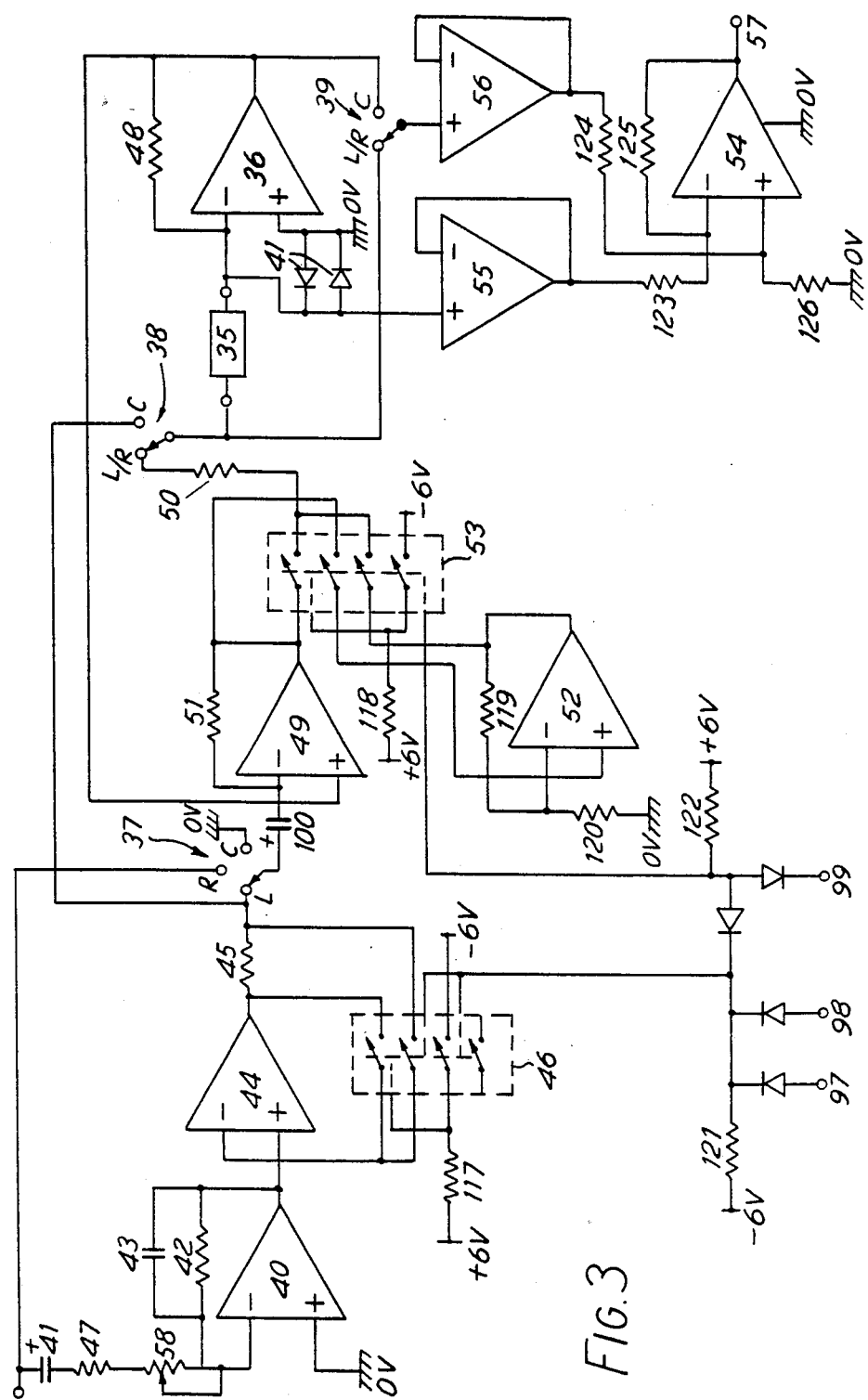

FIG. 3 shows a circuit lay-out for the following bridge section, wherein measurements of the unknown value of a component are made.

A component 35 of unknown value is connected in series with the input of a current measuring (virtual earth) amplifier 36, which converts the current through the component 35 into a voltage.

Function switching is shown at 37, 38 and 39, where contacts are provided for measuring either capacitance C, inductance L or resistance R.

For capacitance measurements, the voltage signal applied to the component 35 is fed via an integrator 40, which shifts the phase of the signal by 90°. Thus, the output voltage of the current measuring amplifier 36 is a measure of the unknown capacitance, as long as the input voltage of the bridge section and the other circuit components remain stable, which is ensured by the design of the sine wave generator. This measurement is also substantially independent of frequency. Diodes 41 across the input of the amplifier 36 are provided as a measure of protection therefor. The integrator 40 requires an input capacitor 41 to prevent any d.c. from adversely affecting its operation and also a resistor 42 across an integrating capacitor 43 to stabilise its d.c. working conditions. A buffer amplifier 44 is also included after the integrator 40. This amplifier 44 may become unstable as the unknown capacitance rises. To overcome this stability problem, a small resistor 45 is included in series with the output of amplifier 44. However, on the 100 V and 1 mV ranges, shown at inputs 97 and 98 respectively, even the small resistance of resistor 45 could be sufficiently large to cause errors, so it is removed by switching the feedback point of the amplifier 44 to the other side of resistor 45, so that its value is divided by the gain of the amplifier. This is achieved by semi-conductor switches 46. Integrator resistor 47 has a series potentiometer 58, which allows some measure of adjustment, so that the capacitance and inductance ranges can be lined up with the resistance ranges, for which the integrator 40 is not used.

For inductance measurements, a constant current is required to be passed through the component 35 rather than applying a constant voltage thereto, as for capacitance measurements. If the output of the current measuring amplifier 36 is held equal to the incoming voltage, feedback resistor 48 will define a constant current in the component 35. A current loop comparator amplifier 49 adjusts the voltage applied to component 35 to maintain this condition. The integrator 40 is again included to shift the phase of the voltage signal by 90° and hence the voltage across the component 35 is a measure of the inductance, and again this is substantially independent of frequency. To ensure stability of the current loop comparator 49, a resistor 50 is included in series with the component 35 so that the gain of the current measuring amplifier 36 is always less than one. The d.c. conditions in the current loop comparator 49 are controlled by a capacitor 100 in series with its input and a suitable resistor 51 as its feedback element.

Resistance measurement is similar to inductance measurement in so far as a constant current is passed through the component 35 and the voltage across it, being a measure of the resistance, is measured. Integrator 40 is not included, as a 90° phase shift is not required to measure resistance. However, an additional problem is encountered on high value ranges when a large gain from the current loop comparator is required. To add extra gain, therefore, a "times 100" amplifier 52 is inserted in series with the current loop comparator 49 by resistance input 99 energising semi-conductor switches 53. This amplifier 52 is switched out of the current loop by switches 53 when not required to ensure that it does not cause any phase shift at high frequencies and hence instability in the current loop.

One further potential source of error arises in the bridge section, namely that the current measuring amplifier 36 is not a perfect virtual earth. This means that small voltages appear at the virtual earth, which could cause errors when relatively small value components are being measured. This can be overcome by using a difference amplifier 54, which allows the errors at the virtual earth to be subtracted. Buffer amplifiers, 55 and 56 are included at the two inputs of difference amplifier 54 to ensure that the measuring currents and voltage are not loaded by this amplifier.

The output of the difference amplifier 54 is thus a reliable measure of the value of the unknown component and it is passed to the gain block via output 57.

Figure 4:
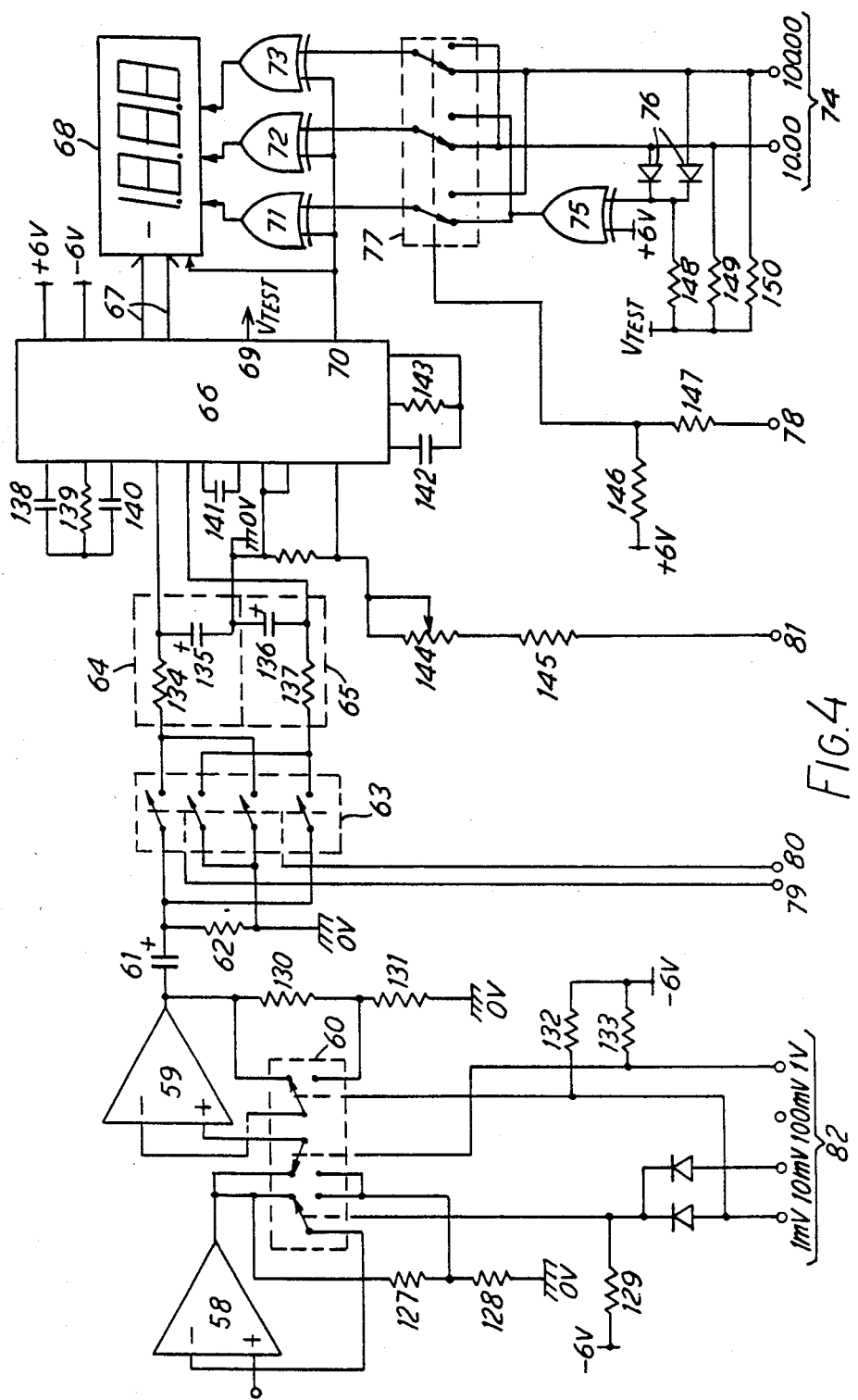

FIG. 4 shows a circuit lay-out of the following three sections shown in FIG. 1, which are the gain block, the phase sensitive detector and the analogue to digital converter and LCD.

The gain block is included to restore the signal to the correct level of magnitude and this block has gains of 100, 10, 1 and 0.1, which are selectable via inputs 82 from the range switching. Two stages of amplification are used, each with a maximum gain of 10, which minimises the phase shift on each stage. This amplification is done by amplifiers 58 and 59. Electronic switching 60 is a 4053 type which has three changeover switches rather than four straight on/off switches, as in the 4066 types. Due to the normally closed action of switches 60, the times 1 (100 mV) position does not require an input signal at 82 from the range switching.

The phase sensitive detector comprises four semiconductor switches 63, which work in pairs. The phase sensitive detector produces outputs which are in phase with its in-phase and anti-phase reference signals (0° and 180° respectively), which are fed into the detector via inputs 79 and 80, and it suppresses those which are at 90° to the phase reference signals. It is ensured that the signal fed to the detector is always in phase with the sine wave generator for measuring either capacitance, resistance or inductance, by generating the reference signals within the logic which generates the sine wave.

The input to the detector is buffered with a capacitor 61 to remove d.c. offset errors and following resistor 62 defines the d.c. working point. The switches 63 are followed by a pair of filters, 64 and 65, to remove the high frequencies and to take away a.c. common mode signals which could interfere with the following analogue to digital converter.

Analogue to digital conversion is achieved by a standard 7106 A/D converter IC, 66, run on its 200 mV range. This requires a reference of 100 mV, which is produced by dividing down from the 1.2 V reference signal, input of which is shown at 81. Digital outputs 67 to liquid crystal display 68 are referenced to an internally generated zero voltage rail and so decimal point circuits which follow must also use this as their zero voltage rail. This voltage is available at $V_{TEST}$ pin 69 on the converter 66.

Decimal points on the LCD 68 are energised by feeding them with a square waveform, which is the inverse of a backplane signal generated from pin 70 in the converter 66, the signal being connected to a set of exclusive OR gates 71, 72 and 73. One input of each gate is fed with the backplane signal and the other input of each gate requires a logic signal to switch the decimal point. For convenience, only two logic signals for the 10.00 and 100.00 decimal point positions are generated by the range switching, with inputs at 74, and the 1.000 position is generated by another exclusive OR gate 75 and diodes 76 which form a NOR gate.

This arrangement is adequate for the inductance and capacitance ranges, but the resistance ranges, which are produced by the same switch positions, do not have the decimal point in the same place. Therefore a set of changeover electronic switches 77 are used, which shift the decimal point circuits when resistance measuring is selected. Hence the 10.00 switch now controls the 100.00 switch and so on, so that the instrument reads correctly on all three functions.

Figure 5:
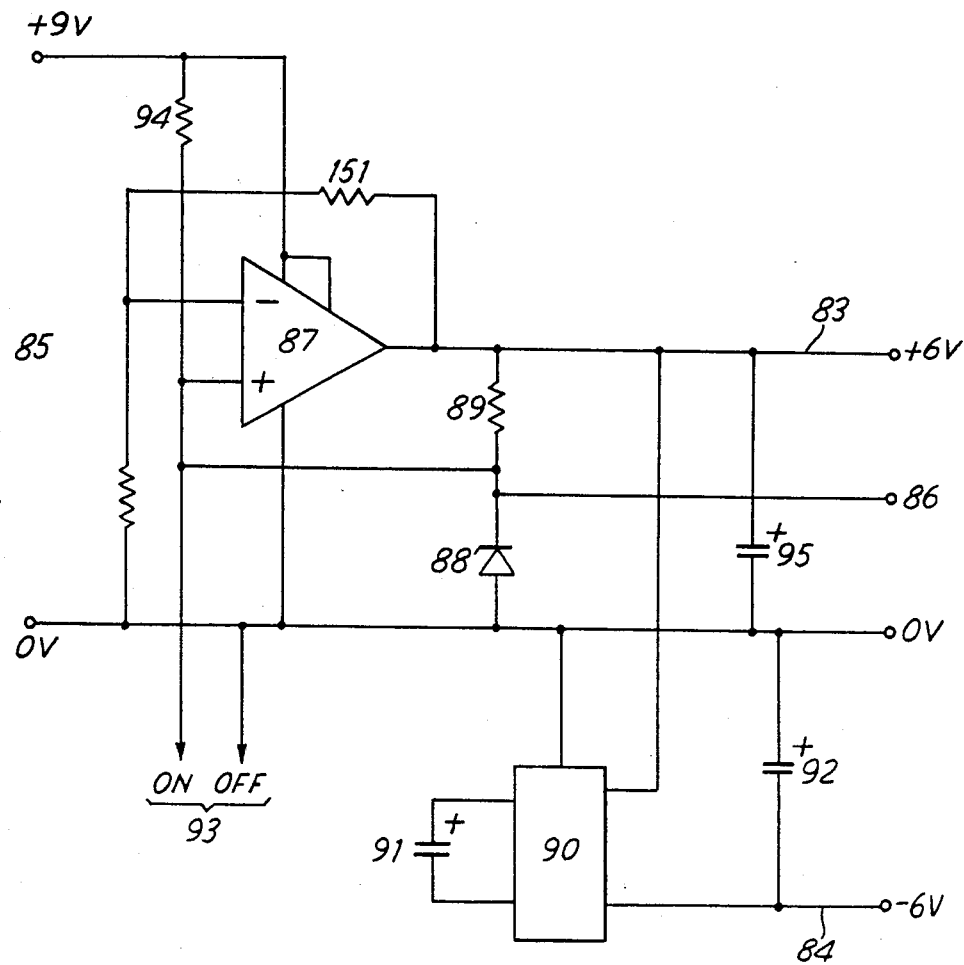

FIG. 5 shows the power supply which provides power for all the circuitry. It produces two rails of about +6 V and −6 V, 83 and 84 respectively, from an incoming 9 V battery supply 85, and it also produces a 1.2 V reference supply, at 86, for the sine wave generator and the converter reference.

The positive supply is achieved by using an operational amplifier 87 and the reference as a voltage regulator. A 1.2 V reference device 88 is run from the output of the amplifier 87 via a resistor 89 to define its working current. As this device 88 is connected to one input of the amplifier and a divided version to the other input, a constant output voltage is maintained.

The negative supply is generated from the positive supply by 7660 voltage mirror device 90 from Intersil, which requires a pump capacitor 91 in addition to an output smoothing capacitor 92.

To reduce the number of contacts on the switches, the OFF position of ON/OFF switch shown at 93 is achieved by short circuiting the reference, which has the effect of shutting down the power supply. A high value resistor 94 ensures that the circuit will start up again when the short circuit is removed from the reference.

The power supply line on the positive side is smoothed by a fairly large capacitor 95 which lowers the a.c. impedance of the power line, thus preventing large signals from the sine wave generator from traversing the bridge section and causing errors.

The table shown below indicates the value or type of circuit components used in the preferred embodiment and numbered as in FIGS. 2 to 5, although it will be appreciated that alternative components and circuit configurations could be utilised. Each column of the table indicates the reference number on the left hand side thereof and the value or type of the component on the right hand side thereof.

| RESISTORS | | | | | | CAPACITORS | | I.C.'s | | SWITCHES | |
|---|---|---|---|---|---|---|---|---|---|---|---|
| 22 | 24K3 | 109 | 90 | 129 | 100K | 23 | 10 | 21 | ½7621 | 18 | 4066 |
| 42 | 10 M | 110 | 10 | 130 | 9K | 41 | 10 | 31 | ½7621 | 30 | 4066 |

-continued

| RESISTORS | | | | | | CAPACITORS | | I.C.'s | | SWITCHES | |
|---|---|---|---|---|---|---|---|---|---|---|---|
| 45 | 6K8 | 111 | 100K | 131 | 1K | 43 | 10 n | 33 | ¼7621 | 46 | 4066 |
| 47 | 9K76 | 112 | 100K | 132 | 100K | 61 | 1 | 36 | ½TL062 | 53 | 4066 |
| 48 | 1K | 113 | 100K | 133 | 100K | 91 | 10 | 40 | ¼7621 | 60 | 4053 |
| 50 | 2K2 | 115 | 100K | 134 | 100K | 92 | 10 | 44 | ¼7621 | 63 | 4066 |
| 51 | 1 M | 116 | 100K | 137 | 100K | 95 | 47 | 49 | ¼7621 | 77 | 4053 |
| 58 | 500 | 117 | 100K | 139 | 4K7 | 100 | 10 | 52 | ¼7621 | 96 | 4066 |
| 62 | 100K | 118 | 100K | 143 | 110K | 114 | 100 p | 54 | 7611 | | |
| 89 | 18K | 119 | 10K | 144 | 2K | 135 | 1 | 55 | ¼7621 | | |
| 94 | 330K | 120 | 100 | 145 | 10K | 136 | 1 | 56 | ¼7621 | | |
| 101 | 150K | 121 | 100K | 146 | 470K | 138 | 220 n | 58 | ½TL062 | | |
| 102 | 365K | 122 | 1 M | 147 | 470K | 140 | 420 n | 59 | ½TL062 | | |
| 103 | 1 M8 | 123 | 10K | 148 | 100K | 141 | 100 n | 87 | 7611 | | |
| 104 | 750K | 124 | 10K | 149 | 100K | 142 | 100 p | | | | |
| 105 | 10K | 125 | 10K | 150 | 100K | | | | | | |
| 106 | 100K | 126 | 10K | 151 | 330K | | | | | | |
| 107 | 9K | 127 | 9K | | | | | | | | |
| 108 | 900 | 128 | 1K | | | | | | | | |

Binary counter 16 is of type 4024 and the logic components are either of type 4070 or 4093 in the preferred embodiment of the present invention.

The range switching consists of a four pole slide switch, each pole having a separate shorting link, which is moved up and down the range by a knob. One pole is used for the voltage input to the bridge section, a second pole is used for the voltage output of the bridge section, a third pole is used to switch the additional capacitor into the oscillator which thus lowers the measuring frequency, and a fourth pole switches the decimal points.

The function switching is also a four pole slide switch. Three poles are used to alter the bridge configuration for the three functions, capacitance C, inductance L and resistance R, and a fourth pole is used to generate a logic signal to alter the decimal point arrangement for the resistance function and also to operate the ON/OFF switch.

The invention therefore provides a relatively inexpensive, easily operated instrument which basically uses sine waves at fixed frequencies to measure resistive, inductive or capacitive components, with a digital presentation, in a small portable case and which is powered from dry batteries.

We claim:

1. An instrument for measuring selectively the resistance, inductance or capacitance of a resistive, capacitive or inductive component, the instrument comprising:

means for generating an a.c. electrical signal of predetermined voltage amplitude, user-operable switching means effective to select a mode for measuring resistance, inductance or capacitance of the component and to multiply said voltage amplitude by a selected scale factor, means for applying the a.c. electrical signal to said component to generate an a.c. output voltage indicative of the impedance of the component, means for adjusting the amplitude of said a.c. output voltage back to a required level in dependence on the selected scale factor, detection means for measuring an amplitude component of the a.c. output voltage indicative of the resistance, inductance or capacitance of said resistive, inductive or capacitive component, as selected by the switching means, the measured component being in-phase with, or in anti-phase to, said a.c. electrical signal, and means, effective in the inductance and capacitance measuring modes, to shift the phase of said generated a.c. electrical signal by 90° prior to said a.c. electrical signal being applied to the component.

2. An instrument as claimed in claim 1 wherein said detection means includes a phase sensitive detector.

3. An instrument as claimed in claim 2 wherein said phase sensitive detector is provided with in-phase and anti-phase reference signals generated by said generating means.

4. An instrument as claimed in claim 3 wherein said means for effecting said phase shift of the a.c. electrical signal comprises an integrator, said integrator providing said phase shift relative to said reference signals.

5. An instrument as claimed in claim 3 wherein said phase sensitive detector suppresses output signals, which are out of phase with said reference signals.

6. An instrument as claimed in claim 1 wherein said measured component of the a.c. output voltage is applied to a digital display, via an analogue to digital converter.

* * * * *